United States Patent
Park et al.

(10) Patent No.: US 9,741,748 B2
(45) Date of Patent: Aug. 22, 2017

(54) THIN FILM TRANSISTOR ARRAY PANEL AND MANUFACTURING METHOD THEREOF

(71) Applicant: Samsung Display Co., Ltd., Yongin-si (KR)

(72) Inventors: Jeong Min Park, Seoul (KR); Sung Kyun Park, Seoul (KR); Jung-Soo Lee, Seoul (KR); Ji-Hyun Kim, Seoul (KR); Jun Chun, Cheongju-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 11 days.

(21) Appl. No.: 14/989,319

(22) Filed: Jan. 6, 2016

(65) Prior Publication Data

US 2016/0118419 A1    Apr. 28, 2016

Related U.S. Application Data

(63) Continuation of application No. 14/158,133, filed on Jan. 17, 2014, now Pat. No. 9,269,726.

(30) Foreign Application Priority Data

Jan. 25, 2013    (KR) .................. 10-2013-0008636

(51) Int. Cl.
*H01L 29/02*    (2006.01)
*G02F 1/136*    (2006.01)
(Continued)

(52) U.S. Cl.
CPC .... *H01L 27/1248* (2013.01); *G02F 1/134363* (2013.01); *G02F 1/136227* (2013.01);
(Continued)

(58) Field of Classification Search
CPC ............. H01L 27/3248; H01L 27/3258; G02F 2001/13629
(Continued)

(56) References Cited

U.S. PATENT DOCUMENTS 7,858,452 B2 * 12/2010 Park .................... G02F 1/13458
257/59
8,023,088 B2    9/2011 Nakao
(Continued)

FOREIGN PATENT DOCUMENTS

JP    2011-081385    4/2011
JP    2012-018970    1/2012
(Continued)

OTHER PUBLICATIONS

Non Final Office Action issued on Mar. 2, 2015, in U.S. Appl. No. 14/158,133.
(Continued)

*Primary Examiner* — David Vu
*Assistant Examiner* — Brandon Fox
(74) *Attorney, Agent, or Firm* — H.C. Park & Associates, PLC

(57) ABSTRACT

A thin film transistor array panel includes a substrate, a gate line and a gate pad disposed on the substrate, a gate insulating layer disposed on the gate line and the gate pad, a data line and a data pad disposed on the gate insulating layer, an organic layer disposed on the data line and the data pad, and a connecting member disposed on one of the gate pad and the data pad, in which the organic layer includes a first portion overlapping the connecting member and a second portion not overlapping the connecting member, and a height of the first portion of the organic layer is greater than a height of the second portion of the organic layer.

13 Claims, 24 Drawing Sheets

(51) Int. Cl.
  *H01L 27/12* (2006.01)
  *H01L 27/32* (2006.01)
  *H01L 29/786* (2006.01)
  *G02F 1/1343* (2006.01)
  *G02F 1/1362* (2006.01)
  *H01L 21/77* (2017.01)

(52) U.S. Cl.
  CPC ........ *H01L 27/124* (2013.01); *H01L 27/1262* (2013.01); *H01L 27/3248* (2013.01); *H01L 27/3258* (2013.01); *H01L 29/78606* (2013.01); *G02F 2001/13629* (2013.01); *H01L 2021/775* (2013.01)

(58) Field of Classification Search
  USPC .............................................. 257/89; 349/46
  See application file for complete search history.

(56) References Cited

U.S. PATENT DOCUMENTS

| | | | |
|---|---|---|---|
| 8,189,162 B2 | 5/2012 | Ahn et al. | |
| 8,269,938 B2 | 9/2012 | Choi et al. | |
| 8,379,177 B2* | 2/2013 | Jung | G02F 1/1343 |
| | | | 349/139 |
| 2006/0001803 A1 | 1/2006 | Park | |
| 2006/0220018 A1* | 10/2006 | Ahn | G02F 1/134363 |
| | | | 257/59 |
| 2007/0159586 A1 | 7/2007 | Kim et al. | |
| 2007/0178617 A1* | 8/2007 | Tsai | G02F 1/1362 |
| | | | 438/30 |
| 2008/0087904 A1 | 4/2008 | Heo et al. | |
| 2014/0152938 A1 | 6/2014 | Lee et al. | |

FOREIGN PATENT DOCUMENTS

| | | |
|---|---|---|
| KR | 10-2009-0129824 | 12/2009 |
| KR | 10-2010-0021152 | 2/2010 |
| KR | 10-2011-0065044 | 6/2011 |
| KR | 10-2011-0119002 | 11/2011 |
| KR | 10-2012-0061507 | 6/2012 |

OTHER PUBLICATIONS

Notice of Allowance issued on Sep. 23, 2015, in U.S. Appl. No. 14/158,133.

* cited by examiner

THIN FILM TRANSISTOR ARRAY PANEL AND MANUFACTURING METHOD THEREOF

CROSS REFERENCE TO RELATED APPLICATION

This application a Continuation of U.S. patent application Ser. No. 14/158,133, filed on Jan. 17, 2014, and claims priority from and the benefit of Korean Patent Application No. 10-2013-0008636, filed on Jan. 25, 2013, which is hereby incorporated by reference for all purposes as if fully set forth herein.

BACKGROUND OF THE INVENTION

Field of the Invention

Exemplary embodiments of the present invention relate to a thin film transistor array panel and a manufacturing method thereof.

Description of the Background

Liquid crystal displays (LCDs) are one of the most widely used flat panel displays. A LCD has two display panels on which field generating electrodes such as pixel electrodes and common electrodes are formed, and a liquid crystal layer interposed between the panels. Voltages are applied to the field generating electrodes to generate an electric field in the liquid crystal layer. Alignment of liquid crystal molecules in the liquid crystal layer is determined by the electric field. Accordingly, polarization of incident light is controlled to display an image in the LCD. The pixel electrodes and the common electrodes that generate the electric field in the liquid crystal layer may be formed on a thin film transistor array panel.

Also in the LCD, a pad portion may be formed to connect a driving circuit to the field generating electrodes of the LCD to apply a gate voltage and a data voltage. If the thickness of a passivation layer in the LCD is problematically large, a height of a contact hole exposing the pad portion may be large such that a connecting member connecting the driving circuit and pad portion may be disconnected.

The connecting member may be formed on the pad portion exposed by the contact hole. In some cases, a bump may also be disposed between the connecting member and the driving circuit to transmit the driving signal to the pad portion from the driving circuit. If a height of the contact hole is increased, it is difficult for the bump to contact the connecting member and the driving circuit in the contact hole. Accordingly, the driving signal may not be transmitted properly.

Also, as the resolution of the LCD is increased, an interval between the pad portions becomes narrower such that the interval between the connecting members formed on the contact hole also becomes narrow. Accordingly, when an error is partially generated in an exposure process used to form the connecting member, adjacent connecting members may be connected such that a driving signal of a desired size may not be transmitted to the pad.

The above information disclosed in this Background section is only for enhancement of understanding of the background of the invention and therefore it may contain information that does not form the prior art that is already known to a person of ordinary skill in the art.

SUMMARY OF THE INVENTION

Exemplary embodiments of the present invention provide a thin film transistor array panel and a manufacturing method thereof reducing a height difference between a pad unit of a signal line and a connecting member to easily connect the pad unit and the connecting member, lowering a height of a contact hole exposing the pad to contact a driving circuit by using a bump, and preventing an unnecessary contact between adjacent connecting members formed on the pads in a high resolution liquid crystal display.

Additional features of the invention will be set forth in the description which follows, and in part will be apparent from the description, or may be learned by practice of the invention.

According to an exemplary embodiment of the present invention, a thin film transistor array panel includes a substrate, a gate line and a gate pad disposed on the substrate, a gate insulating layer disposed on the gate line and the gate pad, a data line and a data pad disposed on the gate insulating layer, an organic layer disposed on the data line and the data pad, and a connecting member disposed on one of the gate pad and the data pad, in which the organic layer includes a first portion overlapping the connecting member and a second portion not overlapping the connecting member, and a height of the first portion of the organic layer is greater than a height of the second portion of the organic layer.

According to an exemplary embodiment of the present invention, a method of manufacturing a thin film transistor array panel includes forming a gate line and a gate pad on a substrate, forming a gate insulating layer on the gate line and the gate pad, forming a data line and a data pad on the gate insulating layer, forming an organic layer on the data line and the data pad, forming a first field generating electrode on the organic layer, forming a passivation layer on the first field generating electrode, forming a connecting member on one of the gate pad and the data pad, and forming a second field generating electrode on the passivation layer, in which the organic layer is formed in a first portion overlapping the connecting member and a second portion not overlapping the connecting member, and a height of the first portion of the organic layer is greater than a height of the second portion of the organic layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
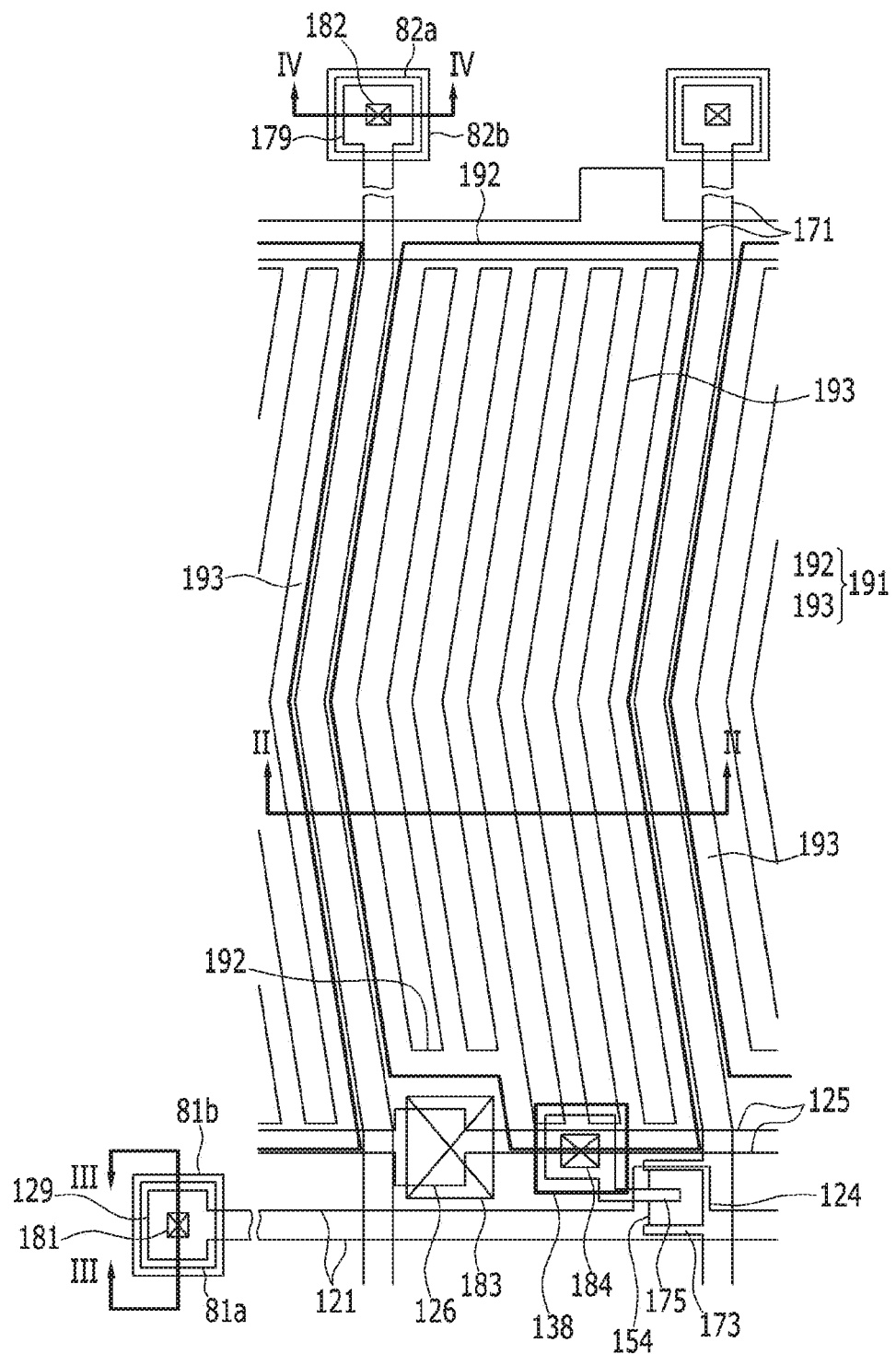
FIG. 1 is a layout view of a thin film transistor array panel according to exemplary embodiments of the invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention. It may also be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing exemplary embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, exemplary embodiments of the invention should not be construed as limited to the particular shapes of regions illustrated herein but are to include deviations in shapes that result, for example, from manufacturing.

Hereinafter, exemplary embodiments of the invention will be described in detail with reference to the accompanying drawings.

Figure 2:
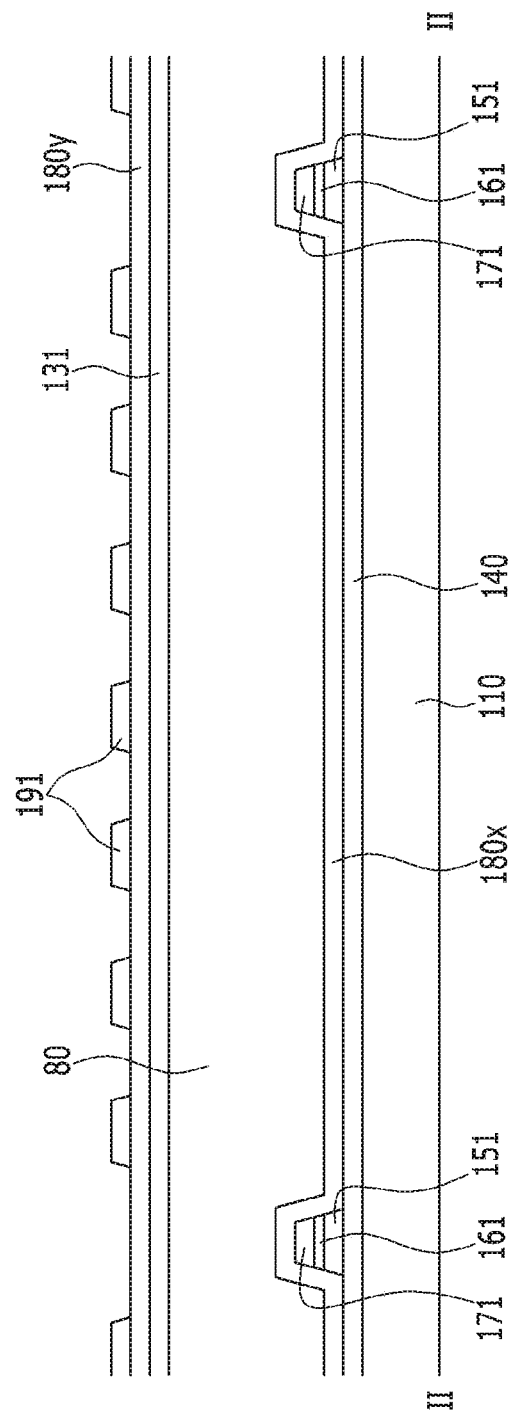
FIG. 2 is a cross-sectional view taken along line II-II of the thin film transistor array panel of FIG. 1 according to exemplary embodiments of the invention.
Figure 3:
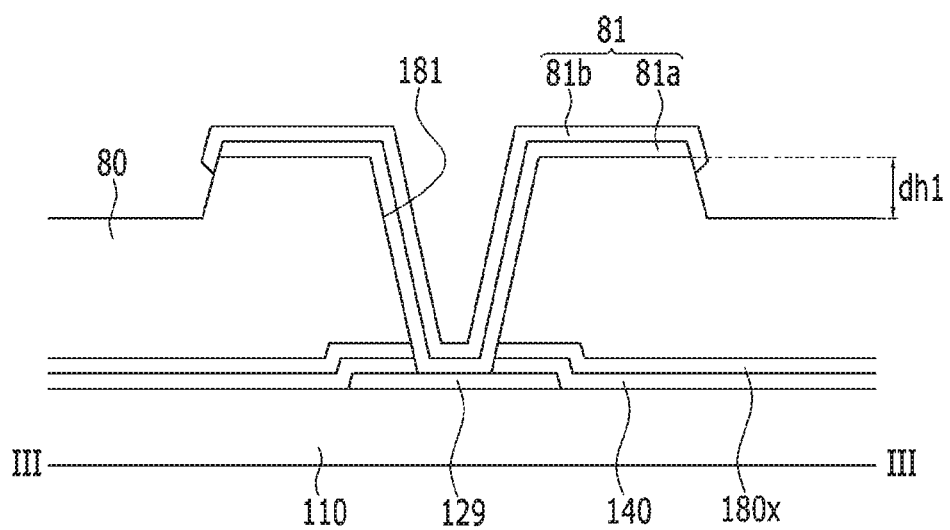
FIG. 3 is a cross-sectional view taken along line of the thin film transistor array panel of FIG. 1 according to exemplary embodiments of the invention.
Figure 4:
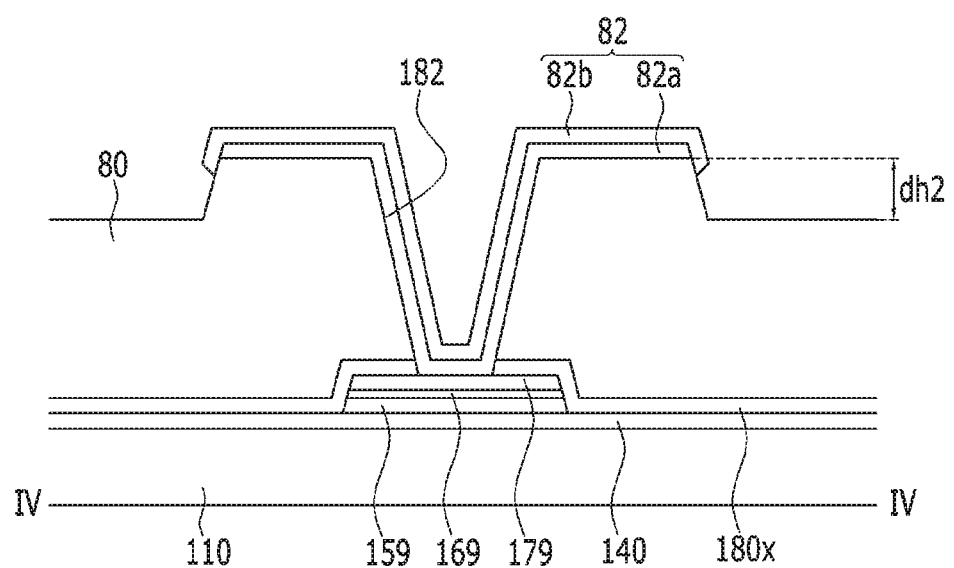
FIG. 4 is a cross-sectional view taken along line IV-IV of the thin film transistor array panel of FIG. 1 according to exemplary embodiments of the invention.

A thin film transistor (TFT) array panel will be described with reference to FIG. 1 to FIG. 4. FIG. 1 is a layout view of a TFT array panel according to exemplary embodiments of the present invention. FIG. 2 is a cross-sectional view taken along line II-II of the TFT array panel of FIG. 1. FIG. 3 is a cross-sectional view taken along line of the TFT array panel of FIG. 1. FIG. 4 is a cross-sectional view taken along line IV-IV of the TFT array panel of FIG. 1.

Referring to FIGS. 1, 2, 3, and 4, a plurality of gate conductors, including a plurality of gate lines 121 and a plurality of reference voltage lines 125, is formed on an insulation substrate 110.

Each gate line 121 includes a plurality of gate electrodes 124 protruding downwardly and a gate pad 129 having a wide area for connecting with another layer or an external driving circuit. A gate driving circuit (not illustrated) for generating a gate signal may be mounted on a flexible printed circuit film (not illustrated) attached on the substrate 110 or directly mounted on the substrate 110.

The reference voltage line 125 may carry a predetermined voltage, such as a common voltage Vcom, may extend in a transverse direction, and may be substantially parallel to the gate line 121. Each reference voltage line 125 may include a plurality of expansions 126.

The gate conductors 121, 125, and 129 may have a single layer or multiple layers, including at least two conductive layers.

A gate insulating layer 140 is formed on the gate conductor 121, 125, and 129. The gate insulating layer 140 may be made of any suitable material, including, for example, an inorganic insulator such as silicon nitride (SiNx) or silicon oxide (SiOx).

A plurality of semiconductors 151 are formed on the gate insulating layer 140. The semiconductors 151 may have an expansion 154 extending toward the gate electrode 124. In some cases, an ohmic contact 161 may be disposed on the semiconductor 151. In some cases, the ohmic contact 161 may be omitted.

A data conductor, including a plurality of data lines 171 and a plurality of drain electrodes 175, is formed on the ohmic contact 161.

The data line 171 may transmit a data signal and may extend in a longitudinal direction, thereby intersecting the gate line 121 and the reference voltage line 125. Each data line 171 may include a plurality of source electrodes 173 extending toward the gate electrodes 124 and a data pad 179 with a wide area for connection with a different layer or an external driving circuit. The data driving circuit (not shown) that generates the data signal may be disposed on a flexible printed circuit film (not shown) that is attached to the substrate 110, or may be directly disposed on the substrate 110.

The drain electrode 175 includes one end of a bar type and another end having a wide area that faces the source electrode 173 with respect to the gate electrode 124.

A first semiconductor 159, first contact assistants 169, and the data pad 179 are disposed on the gate insulating layer 140 (as shown in FIG. 4). In some cases, the first semiconductor 159 and the first contact assistants 169 may be omitted.

The data conductors 171, 175, and 179 may be formed as a single layer or multiple layers, including at least two conductive layers.

The gate electrode 124, the source electrode 173, the drain electrode 175, and expansion 154 of the semiconductor 151 may form a thin film transistor (TFT) that may function as a switching element. The semiconductor 151 may have the same or almost the same planar shape as the data conductors 171, 175, and 179, except for a channel region of the TFT.

A first passivation layer 180x may be disposed on the data line 171, the drain electrode 175, and the exposed expansion 154 of the semiconductor 151. The first passivation layer 180x may be made of any suitable material, including an organic insulating material or an inorganic insulating material.

An organic layer 80 may be disposed on the first passivation layer 180x and may include an organic material. The organic layer 80 may have a flat surface, and may cover the data line 171.

Although not shown, in some cases, the organic layer 80 may be a color filter and a layer disposed on the organic layer 80 (including the color filter) may be further disposed. For example, an overcoat (capping layer) may be disposed on the color filter to prevent a pigment of the color filter from flowing into the liquid crystal layer. The overcoat may be made of an insulating material such as silicon nitride (SiNx).

The first passivation layer 180x, the organic layer 80, and the gate insulating layer 140 may have a first contact hole 181 exposing the gate pad 129.

The first passivation layer 180x and the organic layer 80 have a second contact hole 182 exposing the data pad 179.

The first passivation layer 180x, the organic layer 80, and the gate insulating layer 140 have a third contact hole 183 exposing the reference voltage line 125.

A reference electrode 131 may be formed on the organic layer 80. The reference electrode 131 may be made of a transparent conductive material such as Indium Tin Oxide (ITO) or Indium Zinc Oxide (IZO). The reference electrode 131 may be electrically connected to the reference voltage line 125 through the third contact hole 183 to receive a predetermined voltage, such as the common voltage Vcom, from the reference voltage line 125. The reference electrode 131 may have a planar shape and may be formed as one plate on the surface of the substrate 110. The reference electrode 131 has an opening 138 formed at a position where a fourth contact hole 184 exposing the drain electrode 175 is formed.

A lower layer 81a of a first connecting member 81 may be formed on the gate pad 129 through the first contact hole 181. A lower layer 82a of a second connecting member 82 may be formed on the data pad 179 through the second contact hole 182. The lower layer 81a of the first connecting member 81 and the lower layer 82a of the second connecting member 82 may be formed with the same layer as the reference electrode 131.

A second passivation layer 180y may be formed on the reference electrode 131, and a pixel electrode 191 may be formed on the second passivation layer 180y. The pixel electrode 191 may be made of any suitable material including, for example, transparent conductive material such as ITO or IZO.

The first passivation layer 180x, the organic layer 80, and the second passivation layer 180y have a plurality of the fourth contact holes 184 exposing a portion of the drain electrode 175. The pixel electrode 191 may be electrically connected to the drain electrode 175 through the fourth contact hole 184 to receive the data voltage. The pixel electrode 191 includes a plurality of branch electrodes 193 and lower and upper transverse portions 192 connecting upper and lower ends of the branch electrode 193. The branch electrodes 193 of the pixel electrode 191 may be bent at a center portion of each branch electrode 193. Portions of the branch electrodes 193 may be separated from one another and may be parallel to each other.

An upper layer 81b of the first connecting member 81 may be disposed on the lower layer 81a of the first connecting member 81 including in the first contact hole 181, and an upper layer 82b of the second connecting member 82 may be disposed on the lower layer 82a of the second connecting member 82 including in the second contact hole 182. The upper layer 81b of the first connecting member 81 and the upper layer 82b of the second connecting member 82 may be formed with the same layer as the pixel electrode 191.

A data voltage may be applied to the pixel electrode 191, and a reference voltage may be applied to the reference electrode. The applied data and reference voltages result in generation of an electric field in the liquid crystal layer.

In some cases, as shown in FIG. 2, the reference electrode 131 may be disposed under the second passivation layer 180y, and the pixel electrode 191 may be disposed on the second passivation layer 180y. However, in some cases, the pixel electrode 191 may be disposed under the second passivation layer 180y and the reference electrode 131 may be disposed on the second passivation layer 180y. In general, one of the reference electrode 131 and the pixel electrode 191 may include the branch electrode and the other one may have the planar shape.

In general, according to exemplary embodiments of the invention, two field generating electrodes, including a common electrode and the pixel electrode 193, are disposed on the TFT array panel.

Next, a pad unit of the TFT array panel will be described with reference to FIG. 3 and FIG. 4.

Referring to FIG. 3, the gate pad 129 may be disposed on the substrate 110, and the gate insulating layer 140, the first passivation layer 180x, and the organic layer 80 may be disposed on the gate pad 129.

The gate insulating layer 140, the first passivation layer 180x, and the organic layer 80 may have the first contact hole 181 exposing at least a portion of the gate pad 129. One or more first contact holes 181 may be formed. The first contact holes 181 may have various shapes including, for example, a planar shape, a quadrangular shape, a circular shape, and an oval shape.

The lower layer 81a of the first connecting member 81 may be disposed on the gate pad 129 in the first contact hole 181, and the upper layer 81b of the first connecting member 81 may be disposed on the lower layer 81a of the first connecting member 81.

The second passivation layer 180y may be removed in the region where the gate pad 129 is formed. In some cases, the second passivation layer 180y may be disposed using a mask so that the portions of the second passivation layer 180y in the region where the gate pad 129 is formed are not disposed. A height of a first portion of the organic layer 80 covered by the lower layer 81a of the first connecting member 81 is higher than a height of a second portion of the organic layer 80 not covered by the lower layer 81a of the first connecting member 81. Accordingly, a height difference dh1 between the first portion and the second portion of the organic layer 80 may exist.

Referring to FIG. 4, the gate insulating layer 140 may be disposed on the substrate 110, and the first semiconductor 159, the first contact assistant 169, and the data pad 179 may be disposed on the gate insulating layer 140. In some cases, the first semiconductor 159 and the first contact assistant 169 may be omitted.

The first passivation layer 180x may be disposed on the data pad 179, and the organic layer 80 may be disposed on the first passivation layer 180x.

The first passivation layer 180x and the organic layer 80 have a second contact hole 182 exposing at least a portion of the data pad 179. One or more second contact holes 182 may be formed. The second contact holes 182 may have various shapes including, for example, a planar shape, a quadrangular shape, a circular shape, and an oval shape.

The lower layer 82a of the second connecting member 82 may be disposed on the data pad 179 in the second contact hole 182, and the upper layer 82b of the second connecting member 82 may be disposed on the lower layer 82a of the second connecting member 82.

The second passivation layer 180y may be removed in the region where the data pad 179 is formed. In some cases, the second passivation layer 180y may be disposed using a mask so that the portions of the second passivation layer 180y in the region where the data pad 179 is formed are not disposed. A height of a third portion of the organic layer 80 covered by the lower layer 82a of the second connecting member 82 is higher than a height of a fourth portion of the organic layer 80 not covered by the lower layer 82a of the second connecting member 82. Accordingly, a height difference dh2 between the third portion and the fourth portion of the organic layer 80 may exist.

As described above, the first connecting member 81 and the second connecting member 82 may include the lower layers 81a and 82a and the upper layers 81b and 82b. The lower layers 81a and 82a may be formed with the same layer as the reference electrode 131, and the upper layers 81b and 82b may be formed with the same layer as the pixel electrode 191. In some cases (not shown), the pixel electrode 191 may be disposed on the organic layer 80 and below the reference electrode 131, and the lower layers 81a and 82a may be formed with the same layer as the pixel electrode 191. In the same cases, when the reference electrode 131 is formed above the organic layer 80 and the pixel electrode 191, the upper layers 81b and 82b may be formed with the same layer as the reference electrode 131. Accordingly, the lower layers 81a and 82a may be formed with the same layer of the field generating electrodes 131 and 191 that is disposed at the relatively lower layer of the field generating electrodes 131 and 191, and the upper layers 81b and 82b may be formed with the same layer as the other field generating electrode 131 and/or 191 that is disposed at the relatively higher layer of the field generating electrodes 131 and 191.

As described above, the second passivation layer 180y may not be disposed in the region where the gate pad 129 and the data pad 179 are formed. Accordingly, compared with conventional TFT array panels in which the second passivation layer 180y is disposed in the region where the gate pad 129 and the data pad 179 are formed, the height of the first contact hole 181 and the second contact hole 182 exposing the gate pad 129 and the data pad 179 may be smaller in exemplary embodiments of the invention.

As described above, the first connecting member 81 and the second connecting member 82 may be formed on the gate pad 129 and the data pad 179, respectively, exposed through the first contact hole 181 and the second contact hole 182, respectively.

Accordingly, the gate pad 129 may be prevented from being disconnected from the first connecting member 81, and the data pad 179 may be prevented from being disconnected from the second connecting member 82. Since the height of the first contact hole 181 exposing the gate pad 129 and the second contact hole 182 exposing the data pad 179 is decreased, it is easy for a bump (not shown) disposed in the first contact hole 181 and the second contact hole 182 to contact the driving circuit.

Also, the height of the first portion of the organic layer 80 covered by the lower layers 81a of the first connecting member 81 is higher than the height of the second portion of the organic layer 80 not covered by the lower layers 81a of the first connecting member 81. The height of the third portion of the organic layer 80 covered by the lower layers 82a of the second connecting member 82 is higher than the height of the fourth portion of the organic layer 80 not covered by the lower layers 82a of the second connecting member 82. Accordingly, step differences dh1 and dh2 of the organic layer 80 may exist, and a connection between a plurality of the first connecting members 81 or a plurality of the second connecting members 82 may be prevented. Signal crosstalk according to the connection of a plurality of the first connecting members 81 or a plurality of the second connecting members 82 may therefore be prevented.

According to exemplary embodiments of the invention, one of the two field generating electrodes 131 and 191 overlapping each other may have a plate shape and the other one may have a branch shape (e.g., branch electrode).

However, the two field generating electrodes may have various suitable shapes and are not limited to a plate and/or branch shape.

Figure 5:
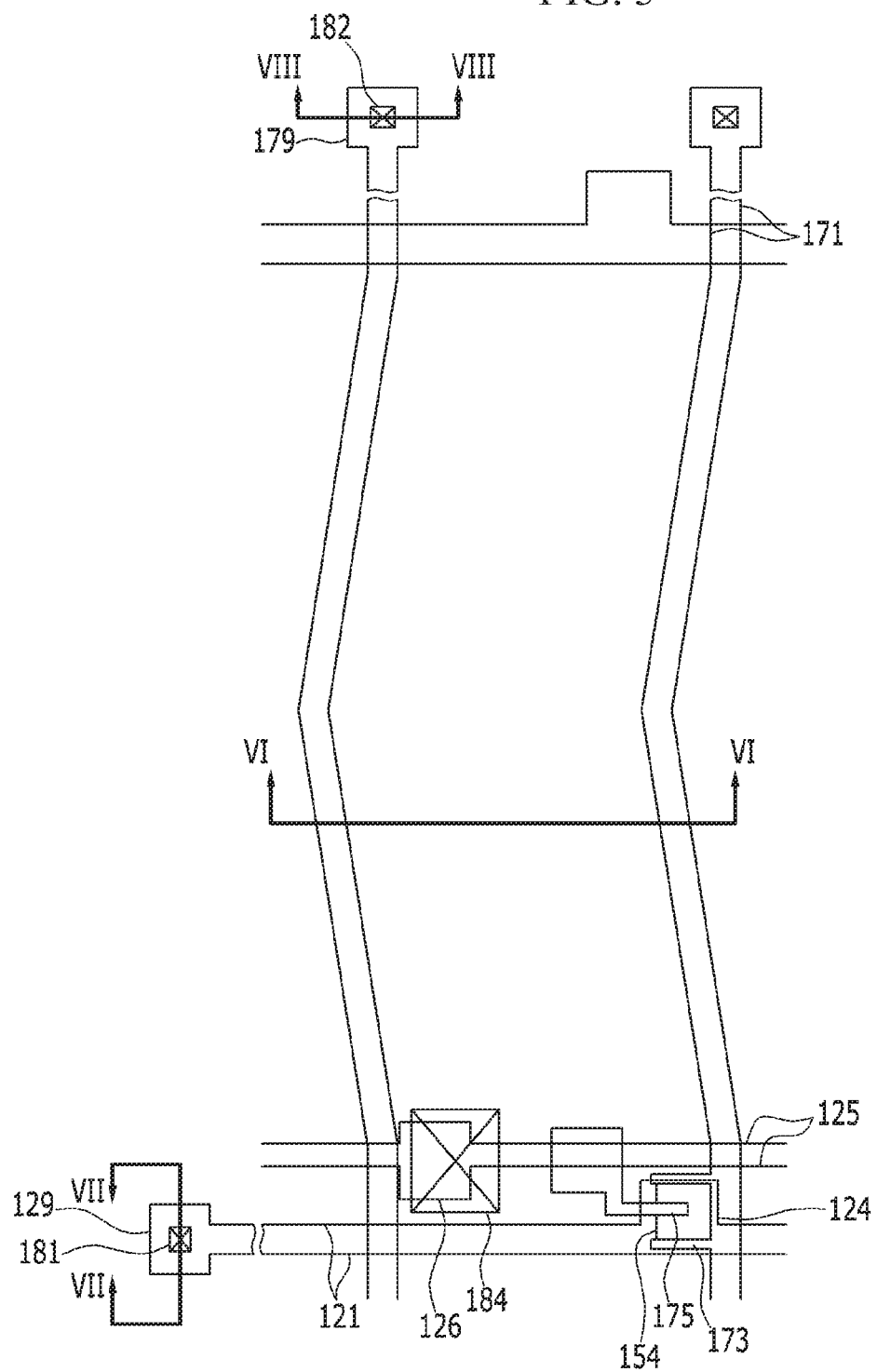
FIG. 5, FIG. 9, and FIG. 13 are layout views of a thin film transistor array panel according to a manufacturing method of a thin film transistor array panel, according to exemplary embodiments of the invention.
Figure 6:
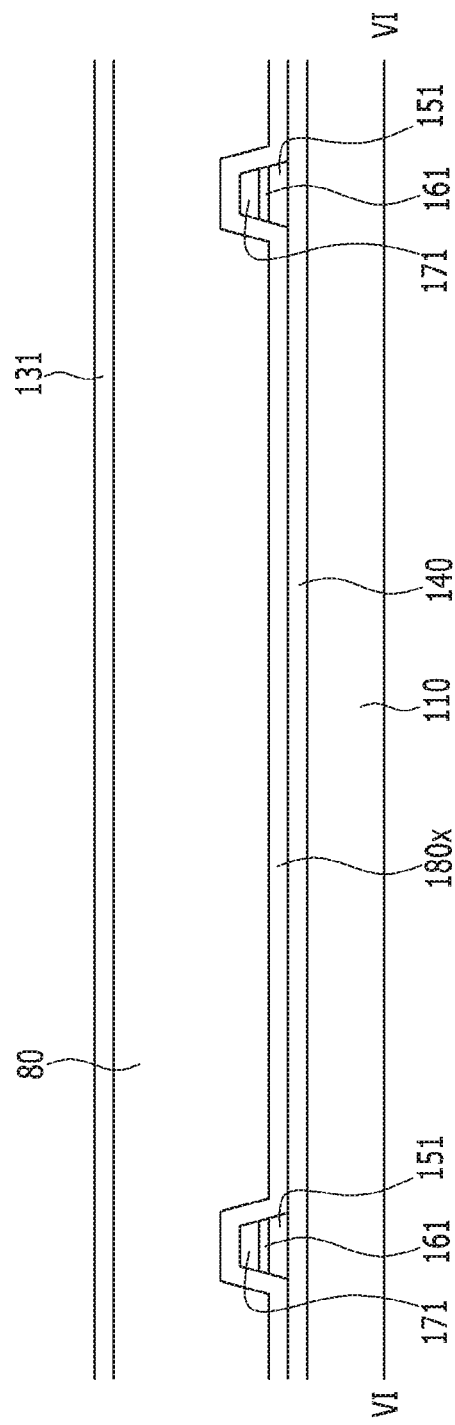
FIG. 6, FIG. 7, and FIG. 8 are cross-sectional views taken along lines VI-VI, VII-VII, and VIII-VIII, respectively, of the thin film transistor of FIG. 5 according to exemplary embodiments of the invention.
Figure 7:
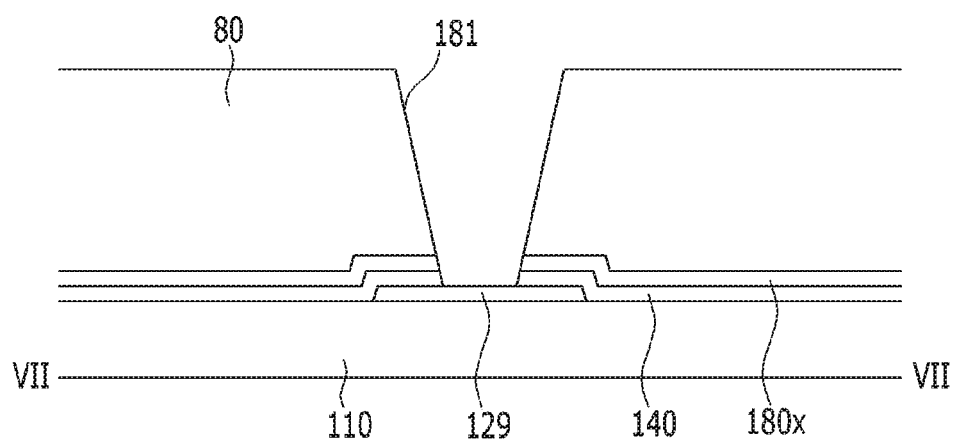
Figure 8:
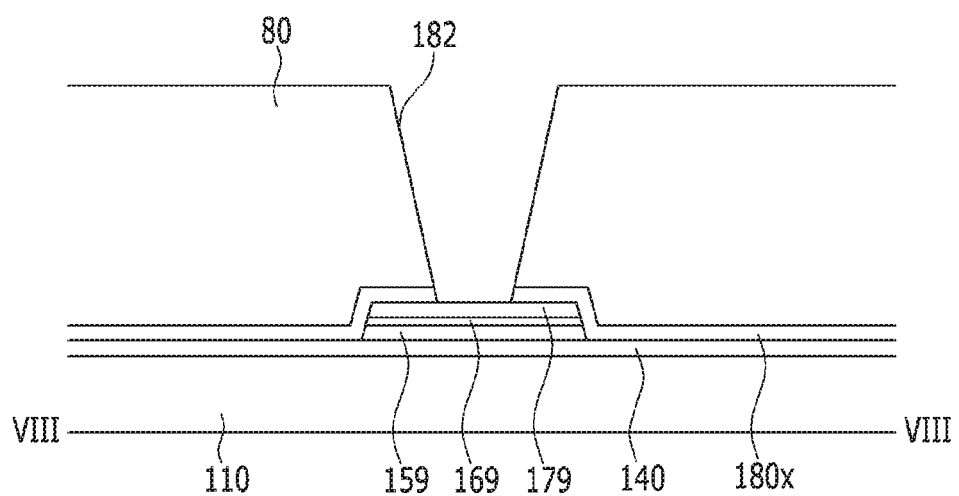
Figure 9:
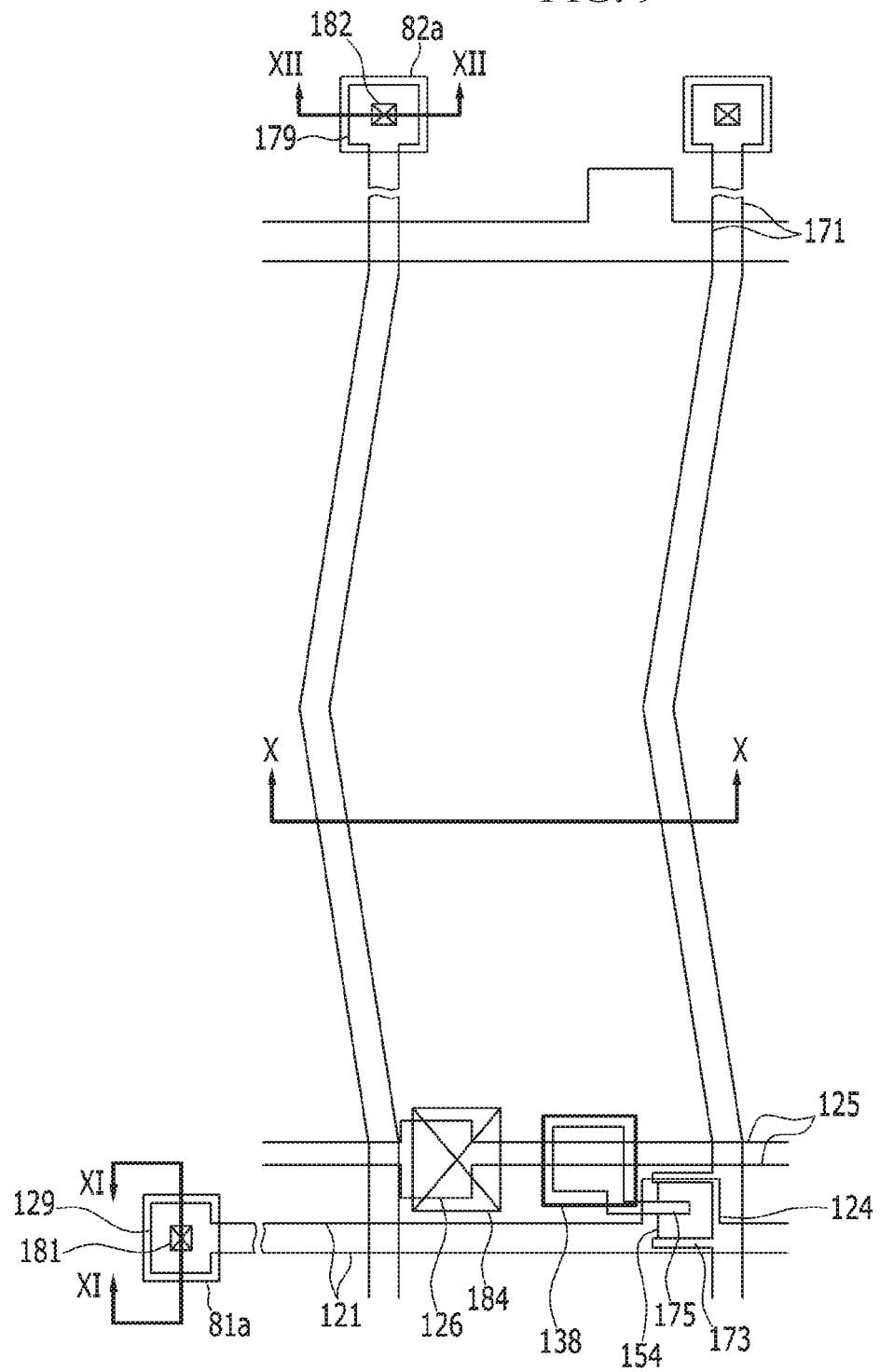
Figure 10:
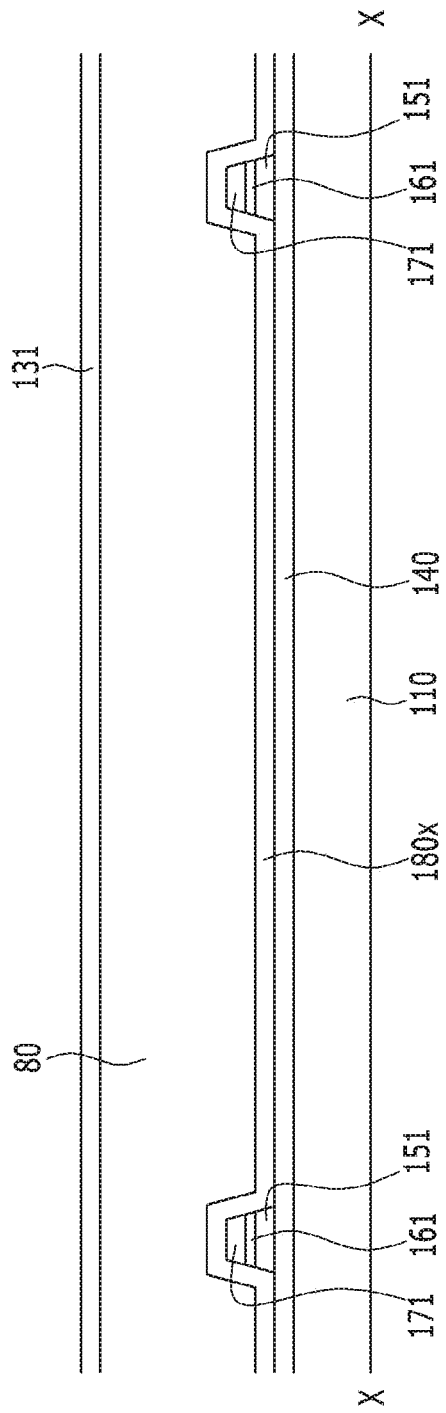
FIG. 10, FIG. 11 and FIG. 12 are cross-sectional views taken along lines X-X, XI-XI, and XII-XII, respectively, of the thin film transistor of FIG. 9 according to exemplary embodiments of the invention.
Figure 11:
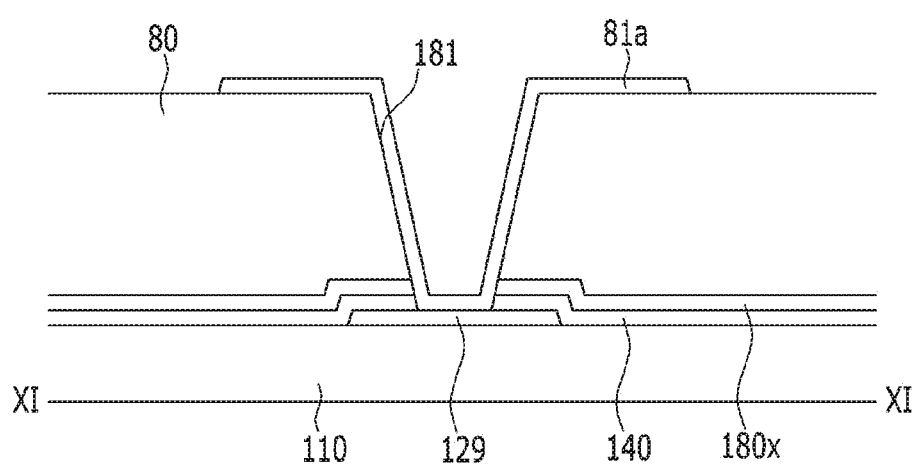
Figure 12:
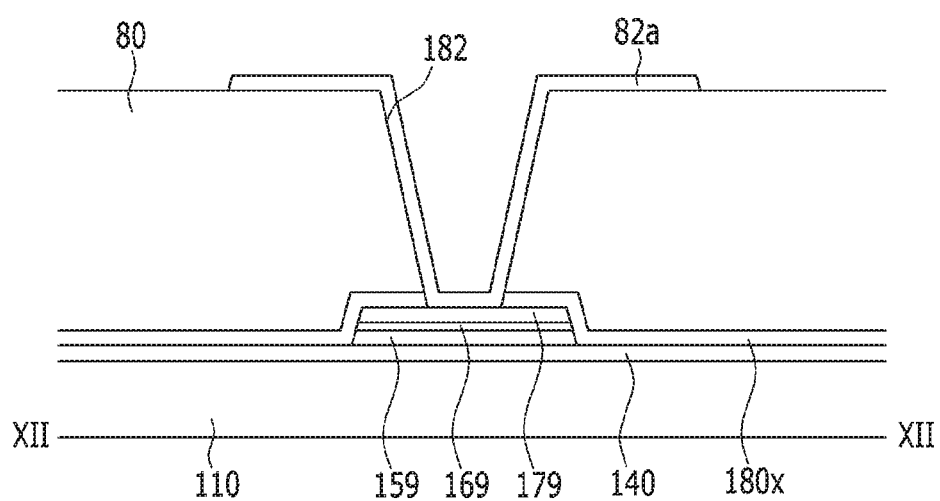
Figure 13:
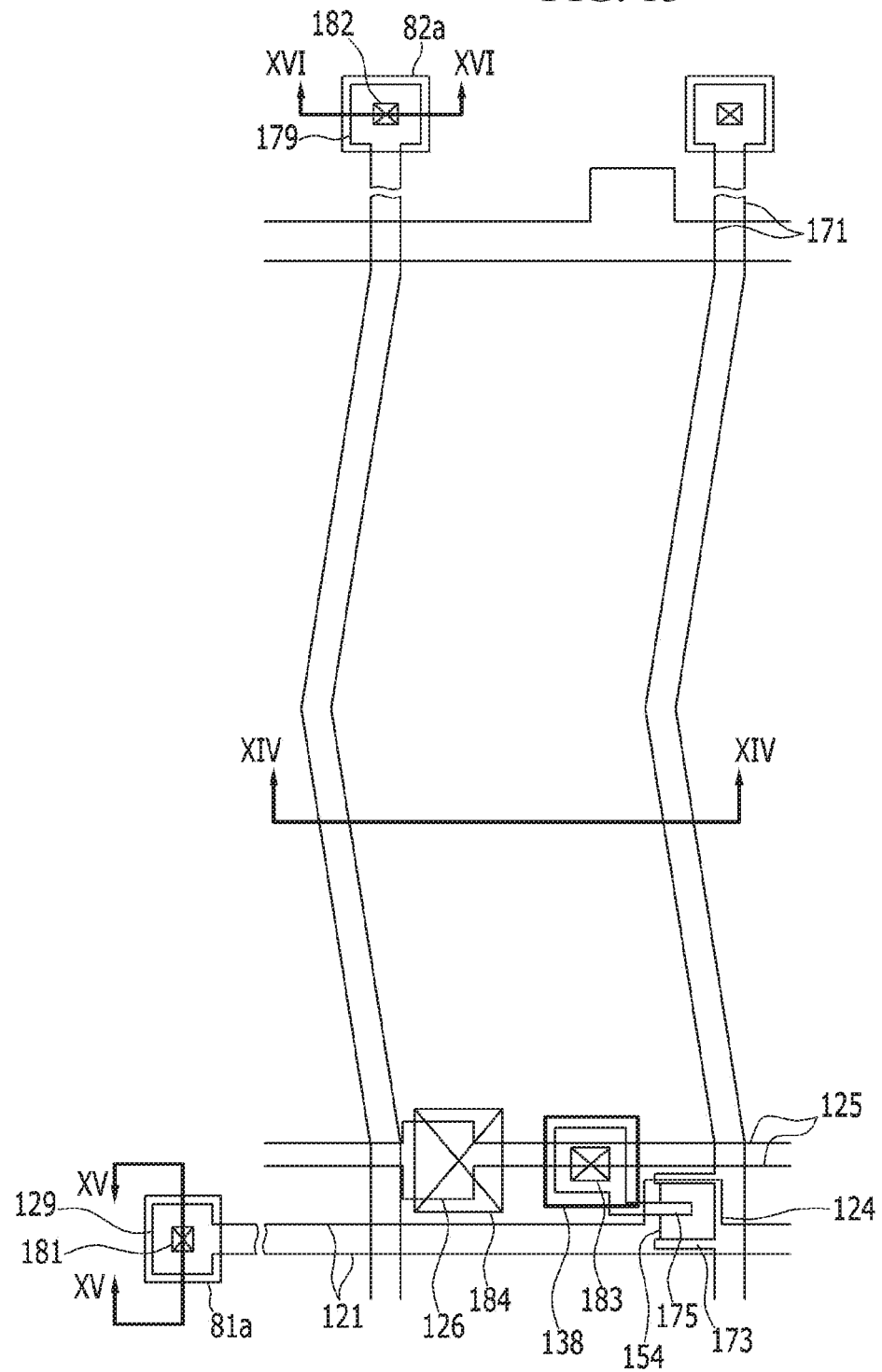
Figure 14:
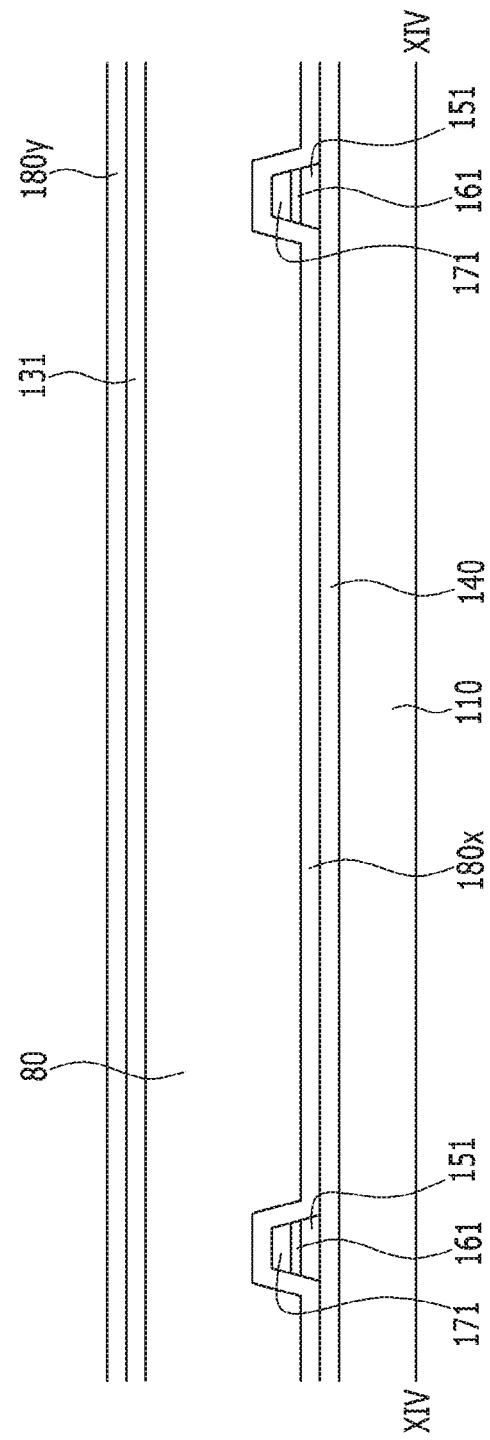
FIG. 14, FIG. 15, and FIG. 16 are cross-sectional views taken along lines XIV-XIV, XV-XV, and XVI-XVI, respectively, of the thin film transistor of FIG. 5 according to exemplary embodiments of the invention.
Figure 15:
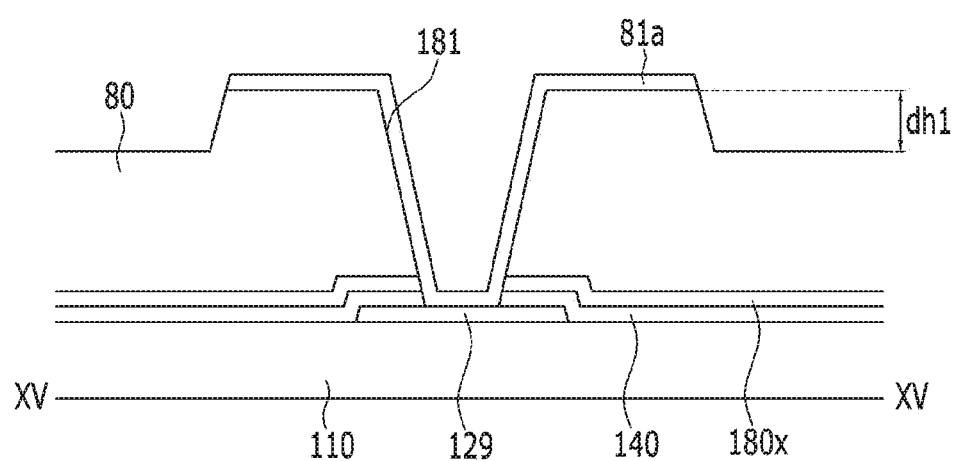
Figure 16:
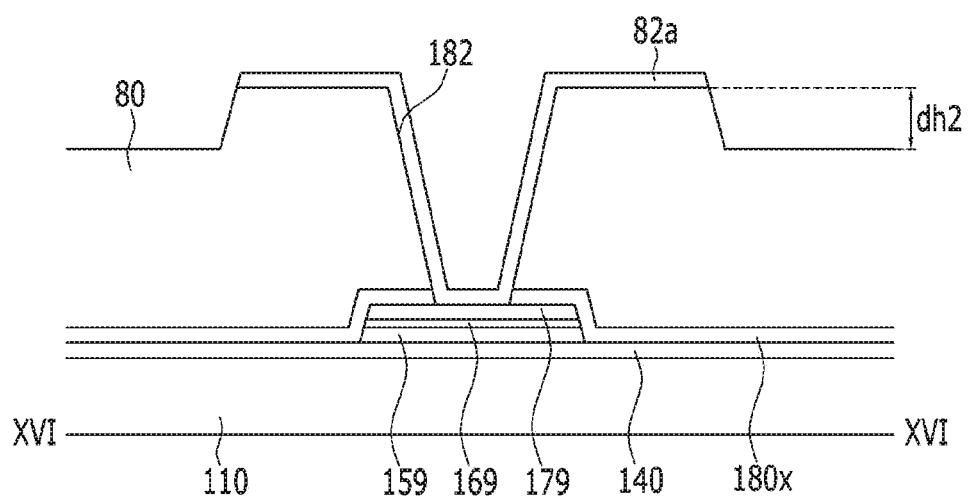
Figure 17:
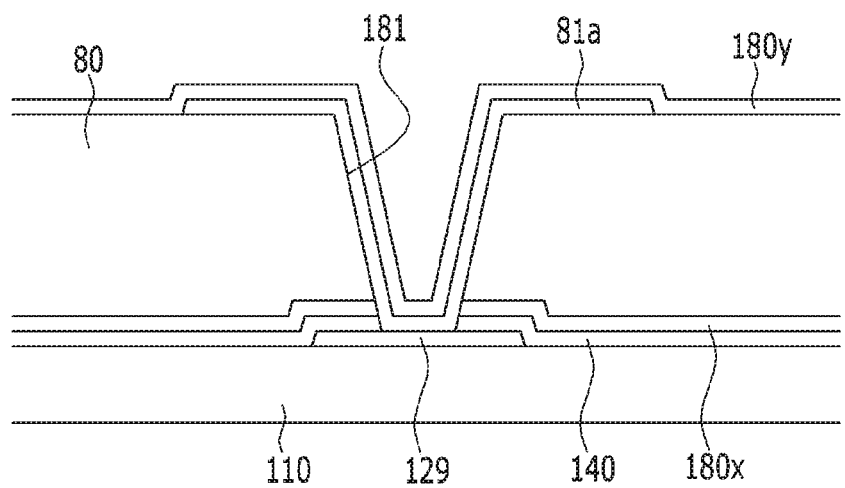
FIG. 17 and FIG. 18 are cross-sectional views showing a portion of a manufacturing process according to a manufacturing method of a thin film transistor array panel, according to exemplary embodiments of the invention.
Figure 18:
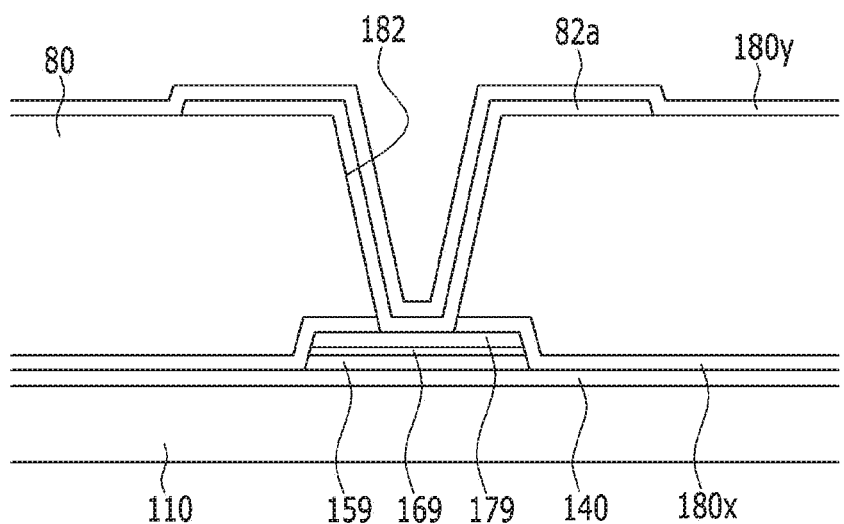
Figure 19:
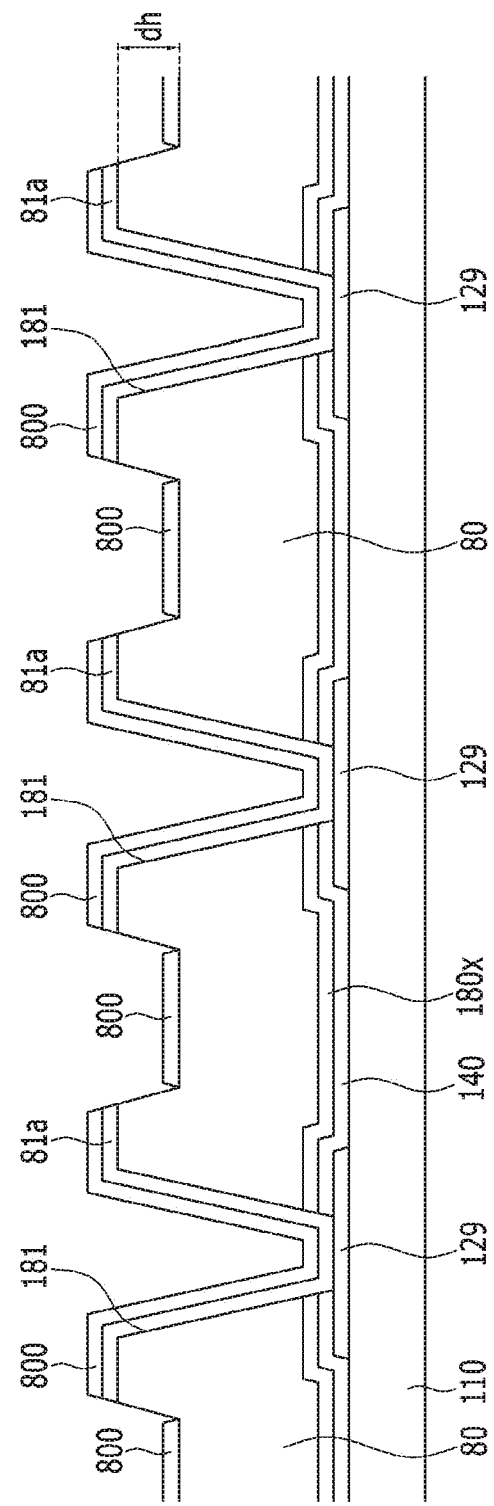
FIG. 19 and FIG. 20 are cross-sectional views showing a portion of a manufacturing process according to a manufacturing method of a thin film transistor array panel, according to exemplary embodiments of the invention.
Figure 20:
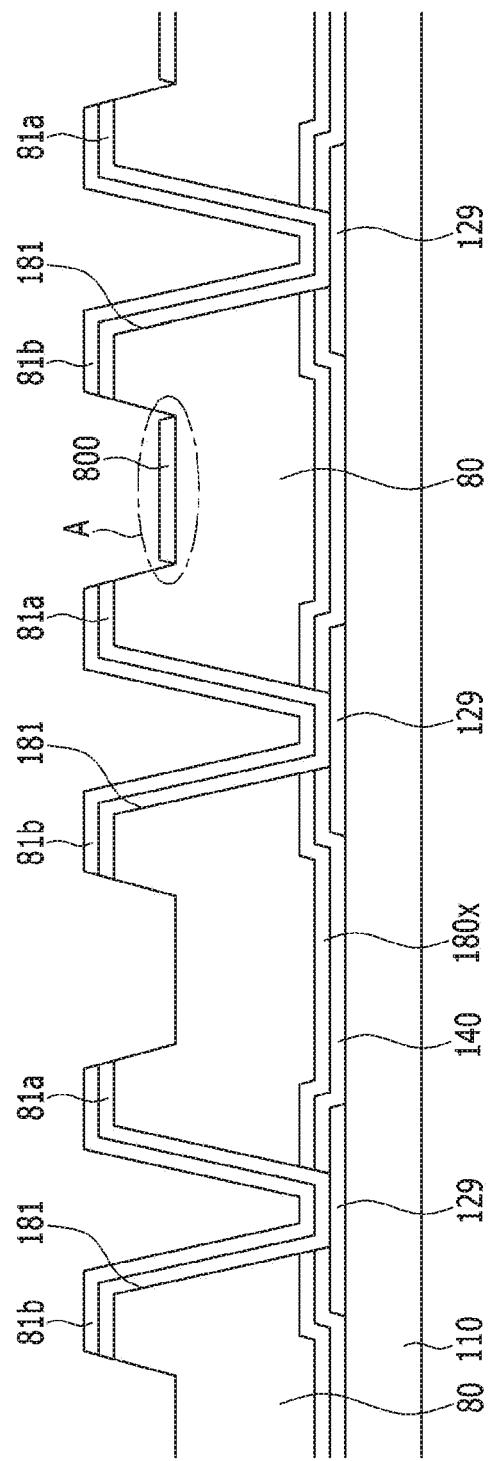

Next, a manufacturing method of a TFT array panel according to exemplary embodiments of the invention will be described with reference to FIGS. 5, 6, 7, 8, 9, 10, 11, 12, 13, 14, 15, 16, 17, 18, 19, and 20. FIG. 5, FIG. 9, and FIG. 13 are layout views of a TFT array panel according to a manufacturing method of the TFT array panel. FIG. 6, FIG. 7, and FIG. 8 are cross-sectional views taken along lines VI-VI, VII-VII, and VIII-VIII of the TFT of FIG. 5. FIG. 10, FIG. 11 and FIG. 12 are cross-sectional views taken along lines X-X, XI-XI, and XII-XII of the TFT of FIG. 9. FIG. 14, FIG. 15, and FIG. 16 are cross-sectional views taken along lines XIV-XIV, XV-XV, and XVI-XVI of the TFT of FIG. 5. FIG. 17 and FIG. 18 are cross-sectional views showing a portion of a manufacturing process according to a manufacturing method of a TFT array panel, according to exemplary embodiments of the invention. FIG. 19 and FIG. 20 are cross-sectional views showing a portion of a manufacturing process according to a manufacturing method of a TFT array panel, according to exemplary embodiments of the invention.

Referring to FIGS. 5, 6, 7, and 8, gate conductors including the gate line 121, the reference voltage line 125, and the gate pad 129 may be formed on the insulation substrate 110. The gate insulating layer 140 may be formed on the gate conductors. The semiconductor 151 having expansion 154, the first semiconductor 159, the ohmic contact 161, the first contact assistant 169, and data conductors including the data line 171, the drain electrode 175, and the data pad 179 may be formed on the gate insulating layer 140.

The first passivation layer 180x may be disposed on the data conductors and the exposed expansion 154 of the semiconductor 151. An organic layer 80 may be disposed on the first passivation layer 180x.

Next, the first contact hole 181 exposing the gate pad 129 may be formed in the first passivation layer 180x, the organic layer 80, and the gate insulating layer 140; the second contact hole 182 exposing the data pad 179 may be formed in the first passivation layer 180x and the organic layer 80; and the third contact hole 183 exposing a portion of the reference voltage line 125 may be formed in the first passivation layer 180x, the organic layer 80, and the gate insulating layer 140.

Next, as shown in FIGS. 9, 10, 11, and 12, a reference electrode 131 may be formed on the organic layer 80, a lower layer 81a of the first connecting member 81 may be formed on the gate pad 129 in the first contact hole 181, and a lower layer 82a of the second connecting member 82 may be formed on the data pad 179 in the second contact hole 182. The lower layer 81a of the first connecting member 81 and the lower layer 82a of the second connecting member 82 may be formed with the same layer as the reference electrode 131.

Next, as shown in FIGS. 13, 14, 15, and 16, the second passivation layer 180y may be formed on the reference electrode 131, and the fourth contact hole 184 exposing at least a portion of the drain electrode 175 may be formed in the first passivation layer 180x, the organic layer 80, and the second passivation layer 180y.

The second passivation layer 180y is not disposed in a region where the gate pad 129 and the data pad 179 are formed. Also, the height of the first portion of the organic layer 80 covered by the lower layers 81a of the first connecting member 81 is higher than the height of the second portion of the organic layer 80 not covered by the lower layers 81a of the first connecting member 81. The height of the third portion of the organic layer 80 covered by the lower layers 82a of the second connecting member 82 is higher than the height of the fourth portion of the organic layer 80 not covered by the lower layers 82a of the second connecting member 82. Accordingly, step differences dh1 and dh2 of the organic layer 80 may be formed.

Next, as shown in FIGS. 1, 2, 3, and 4, a pixel electrode 191 may be formed on the second passivation layer 180y, the upper layer 81b of the first connecting member 81 may be formed on the lower layer 81a, and the upper layer 82b of the second connecting member 82 maybe formed on the lower layer 82a. The upper layer 81b of the first connecting member 81 and the upper layer 82b of the second connecting member 82 may be formed together with the same layer as the pixel electrode 191.

Formation of the second passivation layer 180y and the fourth contact hole 184 will be described in more detail with reference to FIGS. 17, 18, 19, and 20.

Referring to FIG. 17 and FIG. 18, the second passivation layer 180y may be disposed on the reference electrode 131. The second passivation layer 180y may also be disposed in the region where the gate pad 129 and the data pad 179 are formed. Next, while forming the fourth contact hole 184, the second passivation layer 180y disposed at the region where the gate pad 129 and the data pad 179 may be removed by etching. In the etching process for removing the second passivation layer 180y, the second portion and the fourth portion of the organic layer 80 that are not covered by the lower layer 81a of the first connecting member 81 and lower layer 82a of the second connecting member 82 are partially removed together. Accordingly, the step differences dh1 and dh2 of the organic layer 80 are generated as shown in FIG. 15 and FIG. 16.

Next, the step differences dh1 and dh2 of the organic layer 80 will be described with reference to FIG. 19 and FIG. 20.

Referring to FIG. 19 and FIG. 20, a plurality of gate pads 129 may be formed on the substrate 110. The gate insulating layer 140, the first passivation layer 180x, the organic layer 80, and the second passivation layer 180y may be formed on the gate pads 129. The gate insulating layer 140, the first passivation layer 180x, the organic layer 80, and the second passivation layer 180y may have a plurality of first contact holes 181 exposing the gate pads 129. The lower layer 81a of the first connecting members 81 may be formed on the gate pads 129 through first contact holes 181. As described above, the step difference dh1 may be formed between a first portion of the organic layer 80 where the lower layer 81a of the first connecting member 81 is formed and a second portion of the organic layer 80 where the lower layer is not formed.

A conductor layer 800 may then be disposed on the first portion where the lower layer 81a of the first connecting member 81 and on the second portion where the lower layer 81a of the first connecting member 81 is not disposed.

In some cases, when forming the upper layer 81b of the first connecting member 81 through a photolithography process using the conductor layer 800, an error may be partially generated, and although a portion (A) of the conductor layer 800 may not be removed (as shown in FIG. 20), the upper layers 81b of the first connecting members 81 adjacent to each other are not connected to each other. Similarly, because of the step difference dh2 of the organic layer 80 disposed in the region where the data pad 179 is disposed, connection of the upper layers 82b of the second connecting members 82 may be prevented.

By preventing the connection of the plurality of first connecting members 81 or the plurality of second connecting members 82 respectively formed on the plurality of adjacent gate pads 129 and the plurality of adjacent data pads 179, the signal crosstalk according to the connection of the plurality of first connecting members 81 or the plurality of second connecting member 82 does not occur.

Figure 21:
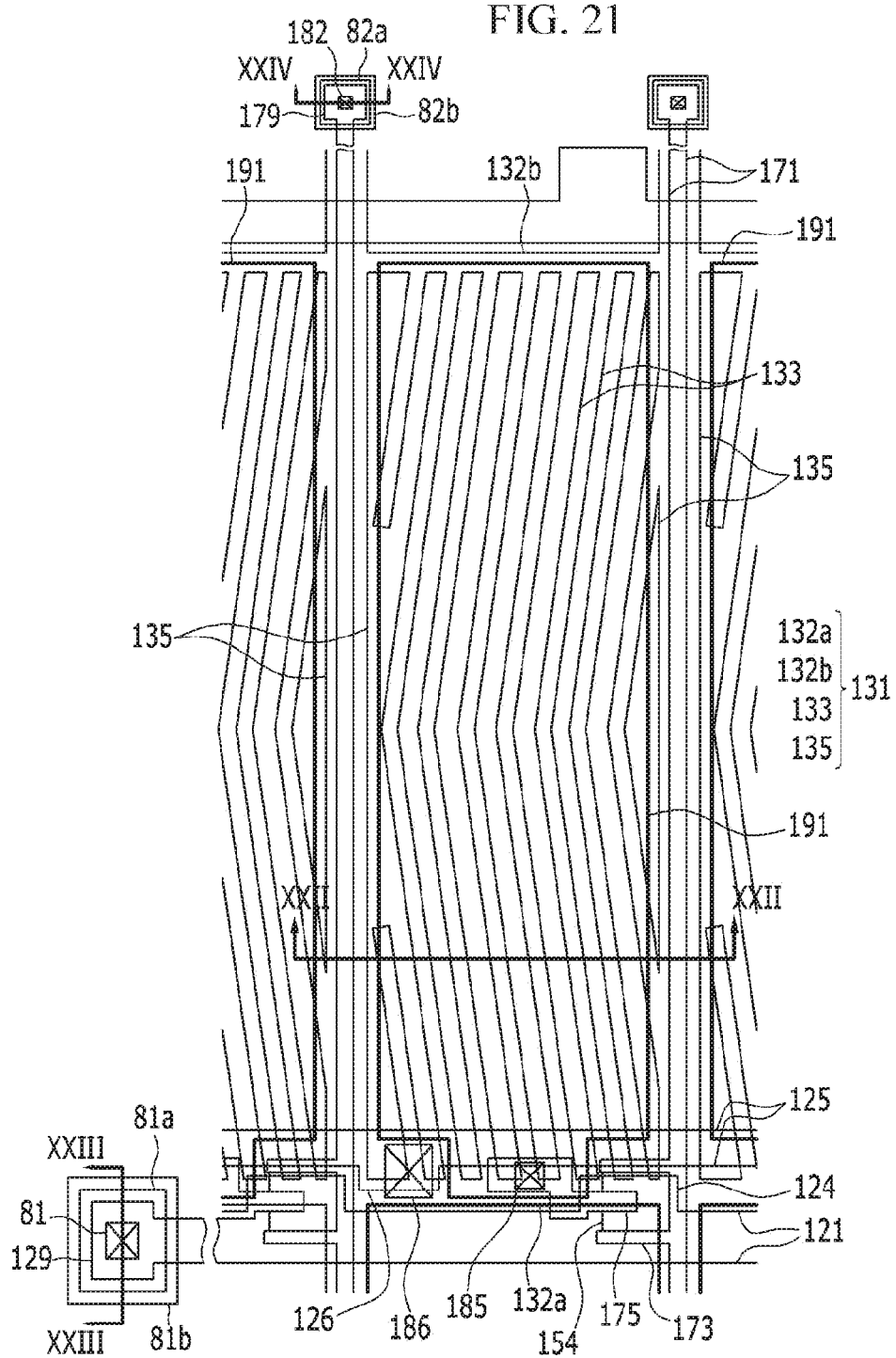
FIG. 21 is a layout view of a thin film transistor array panel according to exemplary embodiments of the invention.
Figure 22:
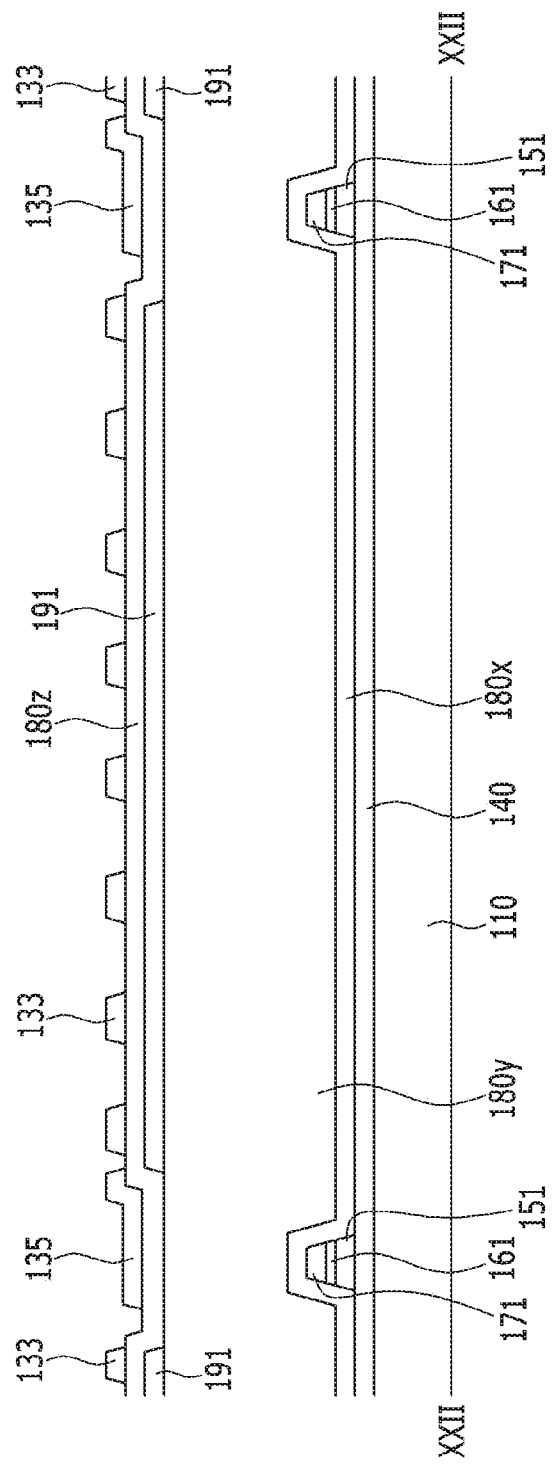
FIG. 22 is a cross-sectional view taken along line XXII-XXII of the thin film transistor array panel of FIG. 21 according to exemplary embodiments of the invention.
Figure 23:
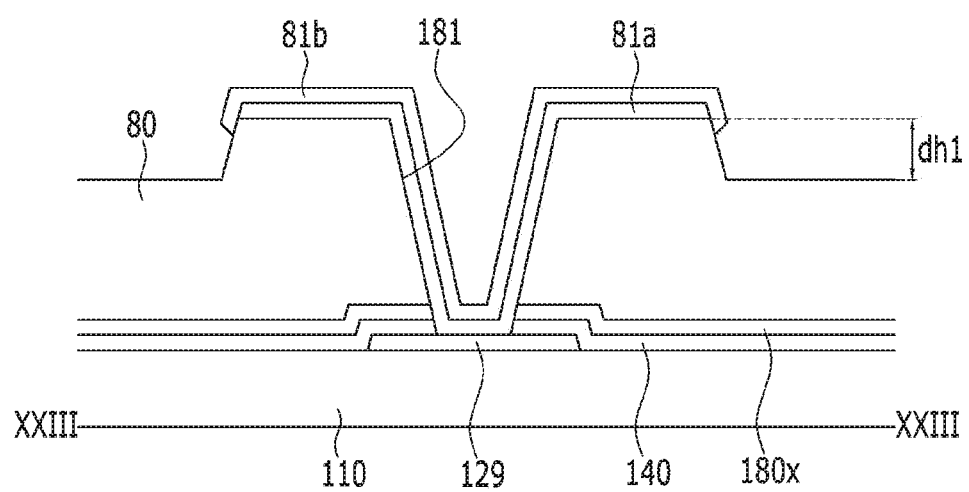
FIG. 23 is a cross-sectional view taken along line XXIII-XXIII of the thin film transistor array panel of FIG. 21 according to exemplary embodiments of the invention.
Figure 24:
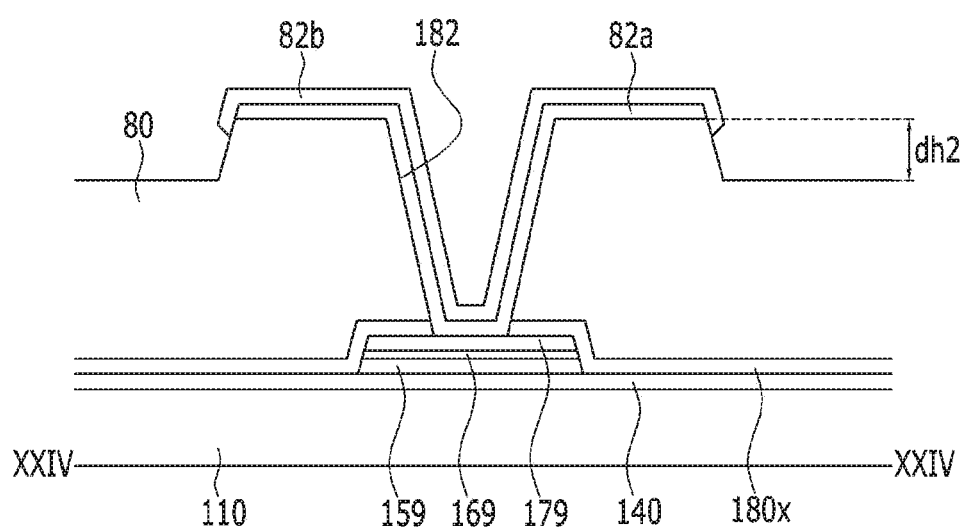
FIG. 24 is a cross-sectional view taken along line XXIV-XXIV of the thin film transistor array panel of FIG. 21 according to exemplary embodiments of the invention.

Next, a thin film transistor array panel according to exemplary embodiments of the invention will be described with reference to FIGS. 21, 22, 23, and 24. FIG. 21 is a layout view of a TFT array panel. FIG. 22 is a cross-sectional view taken along the line XXII-XXII of the TFT array panel of FIG. 21. FIG. 23 is a cross-sectional view taken along the line XXIII-XXIII of the TFT array panel of FIG. 21. FIG. 24 is a cross-sectional view taken along the line XXIV-XXIV of the TFT array panel of FIG. 21.

Referring to FIGS. 21, 22, 23, and 24, a plurality of gate conductors including a plurality of gate lines 121 and a plurality of reference voltage lines 125 may be formed on an insulation substrate 110.

Each gate line 121 may include a plurality of gate electrodes 124 protruding downward and a gate pad 129 having a wide area for connecting with another layer or an external driving circuit.

A gate insulating layer 140 may be formed on the gate conductors.

A plurality of semiconductors 151 may be formed on the gate insulating layer 140. The semiconductors 151 may each have an expansion 154 extending toward the gate electrode 124. In some cases, an ohmic contact 161 may be disposed on the semiconductor 151. In some cases, the ohmic contact may be omitted.

A data conductor including a plurality of data lines 171, drain electrodes 175, and data pads 179 may be formed on the ohmic contact 161. If the ohmic contact 161 is omitted, the data conductor may be formed on the semiconductors 151. The data lines 171 may include a source electrode 173.

The first passivation layer 180x may be formed on the data conductors 171, 175, and 179 and the exposed expansion 154 of the semiconductor 151. An organic layer 80 may be formed on the first passivation layer 180x.

The first passivation layer 180x, the organic layer 80, and the gate insulating layer 140 have the first contact hole 181 exposing the gate pad 129.

The first passivation layer 180x and the organic layer 80 have the second contact hole 182 exposing the data pad 179 and a fifth contact hole 185 exposing a portion of the drain electrode 175.

A plurality of pixel electrodes 191 is formed on the organic layer 80. The pixel electrode 191 may have a planar shape occupying most of a pixel area enclosed by the gate line 121 and the data line 171. The overall shape of the pixel electrodes 191 may be a polygon having sides which are substantially parallel to the gate line 121 and the data line 171. Both edges of the lower side of the pixel electrode 191 at which the thin film transistor is disposed may be chamfered, but the shape is not limited thereto. The pixel electrode 191 may be made of a transparent conductive material, such as ITO or IZO. The pixel electrode 191 may receive a data voltage from the drain electrode 175 through the contact hole 181.

A lower layer 81a of the first connecting member 81 may be formed on the gate pad 129 in the first contact hole 181, and a lower layer 82a of the second connecting member 82 may be formed on the data pad 179 in the second contact hole 182. The lower layer 81a of the first connecting member 81 and the lower layer 82a of the second connecting member 82 may be formed with the same layer as the pixel electrode 191.

The second passivation layer 180y may be formed on the pixel electrode 191, and the reference electrode 131 may be formed on the second passivation layer 180y.

The reference electrode 131 may include a pair of vertical portions 135 covering the data line 171, a plurality of branch electrodes 133 disposed between the two vertical portions 135 and separated from one other, and a lower horizontal portion 132a and an upper horizontal portion 132b to connect ends of the plurality of branch electrodes 133. The vertical portion 135 may be substantially parallel to the data line 171 and may overlap with the data line 171 while covering the data line 171. The lower and upper horizontal portions 132a and 132b may be substantially parallel to the data line 171. The plurality of branch electrodes 133 may be substantially parallel to each other and may form oblique angles with an extension direction of the gate line 121. The oblique angle may be 45 degrees or more. Upper branch electrodes 133 and lower branch electrodes 133 may substantially have inversion symmetry based on a virtual horizontal central line of the reference electrode 131. The adjacent reference electrodes 131 share one vertical portion 135 and are connected to each other.

The gate insulating layer 140, the first passivation layer 180x, the organic layer 80, and the second passivation layer 180y have a plurality of sixth contact holes 186 exposing a portion (e.g., a portion of the expansion 126) of the common voltage line 125.

The reference electrode 131 may receive a predetermined voltage, such as the common voltage, from the common voltage line 125 through the sixth contact hole 186. The reference electrode 131 may overlap the pixel electrode 191. At least two branch electrodes 133, which are adjacent to each other in the reference electrode 131, are overlapped with one pixel electrode 191, which may have a planar shape.

The upper layer 81b of the first connecting member 81 may be formed on the lower layer 81a of the first connecting member 81 including in the first contact hole 181. The upper layer 82b of the second connecting member 82 may be formed on the lower layer 82a of the second connecting member 82 including in the second contact hole 182. The upper layer 81b of the first connecting member 81 and the upper layer 82b of the second connecting member 82 may be formed with the same layer as the reference electrode 131.

When a data voltage is applied to the pixel electrode 191 and a reference voltage is applied to the reference electrode 131, an electric field may be generated in a liquid crystal layer 3.

A pad unit of the TFT array panel will be described with reference to FIG. 23 and FIG. 24.

Referring to FIG. 23, the gate pad 129 may be disposed on the substrate 110, and the gate insulating layer 140, the first passivation layer 180x, and the organic layer 80 may be disposed on the gate pad 129.

A first contact hole 181 may be formed in the gate insulating layer 140, the first passivation layer 180x, and the organic layer 80 to expose at least a portion of the gate pad 129. One or more first contact holes 181 may be formed in various suitable shapes, such as a planar shape, quadrangular shape, a circular shape, and an oval shape.

The lower layer 81a of the first connecting member 81 may be formed on the gate pad 129 exposed through the first contact hole 181, and the upper layer 81b of the first connecting member 81 may be formed on the lower layer 81a of the first connecting member 81.

The second passivation layer 180y may be removed in the region where the gate pad 129 is formed. A height of the first portion of the organic layer 80 covered by the lower layer 81a of the first connecting member 81 is higher than a height of the second portion of the organic layer 80 that is not covered by the lower layer 81a of the first connecting member 81. Accordingly, a height difference dh1 between the first portion and the second portion of the organic layer 80 may exist.

Referring to FIG. 24, the gate insulating layer 140 may be disposed on the substrate 110. The first semiconductor 159 and the first contact assistant 169 may be disposed on the gate insulating layer 140, and the data pad 179 may be disposed on the first contact assistant 169. In some cases, the first semiconductor 159 and the first contact assistant 169 may be omitted.

The first passivation layer 180x may be disposed on the data pad 179, and the organic layer 80 may be disposed on the first passivation layer 180x.

A second contact hole 182 may be formed in the first passivation layer 180x and the organic layer 80 to expose at least a portion of the data pad 179. One or more second contact holes 182 may be formed in various suitable shapes, such as a planar shape, a quadrangular shape, a circular shape, and an oval shape.

The lower layer 82a of the second connecting member 82 may be formed on the data pad 179 exposed through the second contact hole 182, and the upper layer 82b of the second connecting member 82 may be formed on the lower layer 82a of the second connecting member 82.

The second passivation layer 180y may be removed in the region where the data pad 179 is formed. A height of the third portion of the organic layer 80 covered by the lower layer 82a of the second connecting member 82 is higher than a height of the fourth portion of the organic layer 80 that is not covered by the lower layer 82a of the second connecting member 82. Accordingly, a height difference dh2 between the third portion and the fourth portion of the organic layer 80 may exist.

As described above, the first connecting member 81 and the second connecting member 82 may include the lower layers 81a and 82a and the upper layers 81b and 82b. The lower layers 81a and 82a may be formed with the same layer as the reference electrode 131 that is disposed at the relatively lower side among the field generating electrodes, and the upper layers 81b and 82b may be formed with the same layer as the pixel electrode 191 that is disposed at the relatively higher side among the field generating electrodes.

Accordingly, the lower layers 81a and 82a may be formed with the same layer as the field generating electrode that is disposed at the relatively lower side among the field generating electrodes, and the upper layers 81b and 82b may be formed with the same layer as the rest of the field generating electrode that is disposed at the relatively higher side among the field generating electrodes.

As described above, the second passivation layer 180y is not disposed in the region where the gate pad 129 and the data pad 179 are formed. Accordingly, compared with TFT array panels in which the second passivation layer 180y is disposed in the region where the gate pad 129 and the data pad 179 are formed, a height of the first contact hole 181 and the second contact hole 182 exposing the gate pad 129 and the data pad 179 may be decreased.

The first connecting member 81 and the second connecting member 82 may include the lower layers 81a and 82a formed with the same layer as the first field generating electrode, and may include the upper layers 81b and 82b formed with the same layer as the second field generating electrode.

Accordingly, the gate pad 129 may be prevented from being disconnected from the first connecting member 81, and the data pad 179 may be prevented from being disconnected from the second connecting member 82. Since the height of the first contact hole 181 and the second contact hole 182 exposing the gate pad 129 and the data pad 179 is decreased, a bump (not shown) disposed in the first contact hole 181 and the second contact hole 182 may contact the driving circuit.

Further, the height of the first portion of the organic layer 80 covered by the lower layers 81a of the first connecting member 81 is higher than the height of the second portion of the organic layer 80 not covered by the lower layers 81a of the first connecting member 81. The height of the third portion of the organic layer 80 covered by the lower layers 82a of the second connecting member 82 is higher than the height of the fourth portion of the organic layer 80 not covered by the lower layers 82a of the second connecting member 82. Accordingly, step differences dh1 and dh2 of the organic layer 80 is generated. Therefore, a connection between a plurality of the first connecting members 81, a plurality of the second connecting members 82 formed on a plurality of adjacent gate pads 129, or a plurality of adjacent data pads 179 may be prevented. Thus, signal crosstalk according to the connection of a plurality of the first connecting members 81 or a plurality of the second connecting members 82 may be prevented.

According to exemplary embodiments of the invention, one of the two field generating electrodes 131 and 191 overlapping each other may have a planar shape, and the other one of the two field generating electrodes 131 and 191 has a branch shape. It should be understood that the two field generating electrodes may have various suitable shapes, and are not limited to a planar or branch shape.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a thin film transistor array panel, the method comprising:
   forming a pate line and a gate pad on a substrate;
   forming a gate insulating layer on the gate line and the gate pad;
   forming a data line and a data pad on the gate insulating layer;
   forming an organic layer on the data line and the data pad;
   forming a first field generating electrode on the organic layer;
   forming a passivation layer on the first field generating electrode;
   forming a connecting member on one of the gate pad and the data pad; and
   forming a second field generating electrode on the passivation layer,
   wherein:
   the organic layer is formed in a first portion overlapping the connecting member and a second portion not overlapping the connecting member;

a thickness of the first portion of the organic layer is greater than a thickness of the second portion of the organic layer;

forming the passivation layer comprises removing the passivation layer in a first region comprising the gate pad and the data pad; and forming the organic layer comprises forming the organic layer in the first region.

2. The method of claim 1, wherein removing the passivation layer in the first region comprises removing a part of the second portion of the organic layer.

3. The method of claim 2, wherein forming the connecting member comprises:

forming a lower layer of the connecting member simultaneously with the first field generating electrode; and forming an upper layer of the connecting member simultaneously with the second field generating electrode.

4. The method of claim 2, further comprising:

forming a contact hole in the organic layer, the contact hole overlapping one of the gate pad and the data pad, and wherein the connecting member is connected to one of the gate pad and the data pad through the contact hole.

5. A method of manufacturing a thin film transistor array panel, the method comprising:

forming a gate line and a gate pad on a substrate;

forming a gate insulating layer on the gate line and the gate pad;

forming a data line and a data pad on the gate insulating layer;

forming an organic layer on the data line and the data pad;

forming a first field generating electrode on the organic layer;

forming a passivation layer on the first field generating electrode;

forming a connecting member on one of the gate pad and the data pad; and forming a second field generating electrode on the passivation layer, wherein:

the organic layer is formed in a first portion overlapping the connecting member and the one of the gate pad and the data pad, and a second portion not overlapping the connecting member; and a thickness of the first portion of the organic layer is greater than a thickness of the second portion of the organic layer.

6. The method of claim 5, wherein the thickness difference between the first portion and the second portion of the organic layer is greater than a thickness of the gate pad or the data pad.

7. A thin film transistor array panel, comprising:

a substrate;

a gate line and a gate pad disposed on the substrate;

a gate insulating layer disposed on the gate line and the gate pad;

a data line and a data pad disposed on the gate insulating layer;

an organic layer disposed on the data line and the data pad; and a connecting member disposed on one of the gate pad and the data pad;

wherein:

the organic layer comprises a first portion overlapping the connecting member and the one of the gate pad and the data pad, and a second portion not overlapping the connecting member; and a thickness of the first portion of the organic layer is greater than a thickness of the second portion of the organic layer.

8. The thin film transistor array panel of claim 7, further comprising:

a first field generating electrode and a second field generating electrode overlapping each other and disposed on the organic layer; and a passivation layer disposed between the first field generating electrode and the second field generating electrode;

wherein:

the organic layer is disposed in a first region comprising the gate pad and the data pad; and the passivation layer is not disposed in the first region.

9. The thin film transistor array panel of claim 8, wherein the connecting member comprises:

a lower layer comprising the same layer as the first field generating electrode; and an upper layer comprising the same layer as the second field generating electrode.

10. The thin film transistor array panel of claim 7, further comprising:

a contact hole overlapping the one of the gate pad and the data pad, wherein the connecting member is connected to the one of the gate pad and the data pad through the contact hole.

11. The thin film transistor array panel of claim 8, wherein one of the first field generating electrode and the second field generating electrode has a plate shape, and the other of the first field generating electrode and the second field generating electrode comprises a branch electrode.

12. The thin film transistor array panel of claim 7, wherein the thickness difference between the first portion and the second portion of the organic layer is greater than a thickness of the gate pad or the data pad.

13. The thin film transistor array panel of claim 7, wherein the upper layer covers the entire lower layer.

* * * * *